United States Patent [19] [11] 4,047,122
Rao [45] Sept. 6, 1977

[54] FREQUENCY COMPENSATED DIFFERENTIAL AMPLIFIER

[75] Inventor: Dhulipala M. Rao, Pittsburgh, Pa.

[73] Assignee: Westinghouse Electric Corporation, Pittsburgh, Pa.

[21] Appl. No.: 656,993

[22] Filed: Feb. 11, 1976

[51] Int. Cl.² .............................................. H03F 1/36
[52] U.S. Cl. ................................. 330/84; 330/30 D; 330/30 R; 330/69; 330/124 R
[58] Field of Search ................... 330/30 R, 30 D, 84, 330/124 R, 69

[56] References Cited
U.S. PATENT DOCUMENTS 3,103,601  9/1963  Gordon et al. .................. 330/84 X
3,358,241  12/1967  Hull ............................. 330/30 R X Primary Examiner—Rudolph V. Rolinec
Assistant Examiner—Lawrence J. Dahl
Attorney, Agent, or Firm—C. M. Lorin

[57] ABSTRACT

In differential input DC gain amplifiers with high input impedance, a capacitive attenuator is built-in in order to reduce the amplifying effect on the AC component due to interference by the industrial power lines. Such attenuation is obtained by feeding back through cross capacitors the AC signal at one output to the input on the opposite side so that the ratio of the differential outputs to the differential inputs for the AC component is substantially unity.

1 Claim, 3 Drawing Figures

018# FREQUENCY COMPENSATED DIFFERENTIAL AMPLIFIER

BACKGROUND OF THE INVENTION

The invention relates to direct current amplifiers in general, and more particularly to a combination of two operational amplifiers mounted as a differential amplifier to respond to a differential signal applied to two input terminals thereof. Such circuitry is particularly applicable to an analog data acquisition system for the detection of low level signals transmitted from remote locations through isolated cables. Such analog data acquistion systems are generally multiplexed with a plurality of measuring points and the acquired analog data are converted into digital data for digital treatment, for instance by a computer.

Because they are often used with narrow band data handling systems with long lines between grounded transducers and amplifiers, operational amplifiers experience alternating current and direct current errors through the amplifying stage, errors which appear as a noise or drift which might severely impair the usually high sensitivity of this type of amplifiers. Signal error due to alternating current mostly is caused by neighboring industrial AC network, at 60 Hertz inducing into the input lines, despite cable isolation and common grounding, an interference signal appearing as an amplified noise with the amplified analog output signal.

It is known to combine two operational amplifiers so that each respond by its non-inverting input to one pole of a single voltage input, the inverting inputs being connected together through a resistor. This is known as a differential amplifier arrangement. If an AC signal is superimposed on the input signal, the high gain characteristic of the arrangement will cause saturation of the amplifying stage by the AC current. Therefore, it is not practical to attempt to eliminate the AC signal by filtering after the amplifying stage. For this reason filtering the AC component has been effected rather at the input side. However, this method of elimination of the AC noise is not satisfying either for several reasons. First, if the filtering action is moderate some AC component remains unfiltered. This fraction, however small at the input, happens to be amplified and while the saturation problem might not occur, substantial noise still will appear at the output. If the filtering action is increased to the maximum, a relatively large resistance has to be inserted in series with the circuitry input in order to generate sufficient AC effect, and this resistance causes a leakage, e.g. DC current to flow, which entails an offset error. Moreover, resistors being by nature exposed to temperature variations, a thermal drift will also occur.

The object of the present invention is to provide a differential operational amplifier which is substantially free from alternating current noise.

Another object of the present invention is to filter out an alternating current component in a direct current amplifier with a small capacitance.

Still another object of the present invention is to substantially attenuate the amplification of a differential amplifier for alternating current noise at a frequency above a predetermined range.

A further object of the present invention is to obtain in a differential amplifier active filtering providing good normal mode rejection of any alternating current component above a predetermined frequency without degeneration when the closed loop direct current gain of the amplifier is being varied.

SUMMARY OF THE INVENTION

The invention relates to the art of differential operational amplifiers. The purpose is to eliminate any noise between the differential outputs due to amplification of an alternative current component present between the input terminals of the amplifier. To this effect, a capacitive attenuator is built-in within the differential amplifier with capacitors cross coupling the outputs with the opposite inputs of the amplifier. Attenuation is obtained above a predetermined frequency with the use of only small capacitors as a result of the gain in the normal mode.

The particular configuration of such built-in active filter provides this unique advantage of using small-valued capacitors to achieve a low cut-off frequency. A direct consequence is that low cost, high quality miniaturized and standardized filtering has been made possible thereby.

DESCRIPTION OF THE PREFERRED EMBODIMENT

Figure 1:
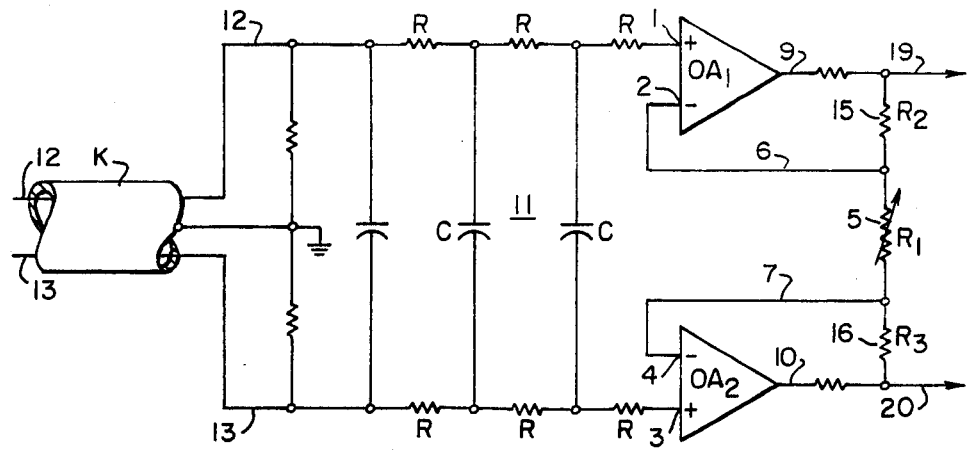
FIG. 1 shows a differential amplifier of the prior art in which the undesired alternating current component is filtered out with a capacitive arrangement forming a passive filter.

FIG. 1 shows a differential input direct current amplifier with high gain and high input impedance of the prior art in which AC rejection is provided by a passive filter at the input side.

Two operational amplifiers $OA_1$, $OA_2$ have inverting inputs 2, 4 connected to the two ends of a variable resistor 5 via respective lines 6, 7 which are also connected in a balanced arrangement to the respective amplifier outputs 9, 10 and to terminal lines 19, 20 by a network of resistors including resistors 15, 16 adjusted to the characteristics of the associated operational amplifier. Input signals are impressed on the non-inverting inputs 1, 3, from a 2-wire cable K transmitting on lines 12, 13 analog data therebetween, via an RC network 11 which is used to filter out any AC component. The RC network includes resistors R in series with the respective inputs and capacitors C thereacross. These resistors required for filtering are not desirable because they introduce a leakage current. They also are temperature sensitive thereby causing an offset current which affects the measured signal. Besides any portion of the AC component not filtered out and appearing on the noninverting input 1 or 3 is amplified with a gain of $(R_1+R_2+R_3/R_1)$, assuming the resistance of resistors 5, 15 and 16 as $R_1$, $R_2$ and $R_3$, respectively. The amplified AC current appears on lines 19 and 20 with the amplified DC signal.

Instead of such AC filtering in the front end of the amplifiers, filtering capacitors could also be placed after the amplifying stage across resistors 15 and 16. However, this solution is not acceptable since the AC component allowed to go through the amplifier stage would cause saturation of the operational amplifiers.

Figure 2:
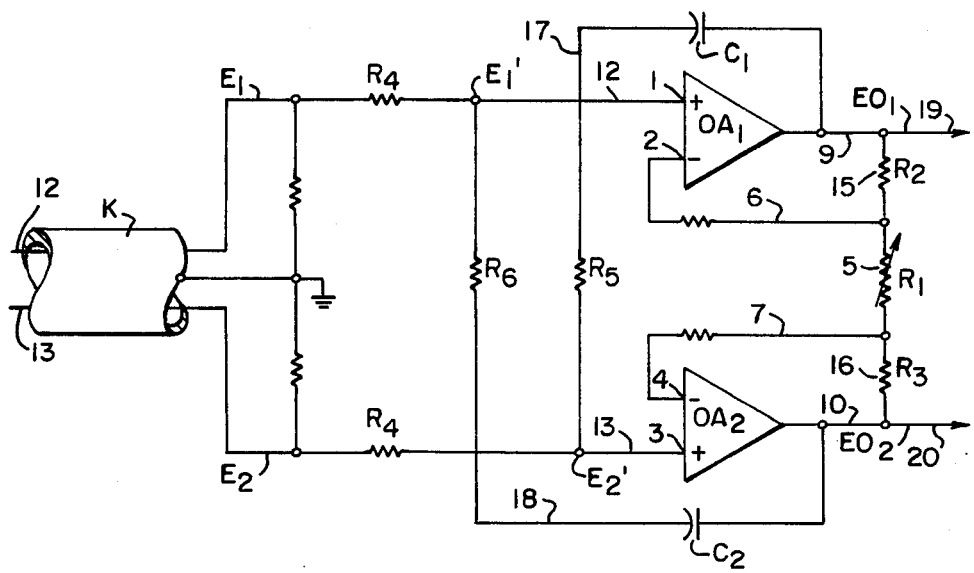
FIG. 2 illustrates diagrammatically active filtering, according to the present invention, of the undesired alternating current component in a differential amplifier.

Referring to FIG. 2, the differential amplifier according to the present invention is shown diagrammatically. Identical portions of the circuit of FIG. 1 have been used for convenience and clarity in order to emphasize the difference between the two figures. Instead of a filter such as 11 in FIG. 1, the circuit of FIG. 2 includes capacitors $C_1$ and $C_2$ connected in respective feedback loops from the outputs 9 and 10 of the operational amplifiers $OA_1$, $OA_2$. These feedback loops are cross-connected so as to include the non-inverting input of the opposite operational amplifier ($OA_2$, $OA_1$).

A resistor of minimal value, $R_5$ or $R_6$ is also provided as part of the feedback loop. As a result, the amplified AC component signal appearing with the DC component signal at the output (for instance 9) is reinjected at the input of the opposite operational amplifier (for instance $OA_2$) as a regenerative feedback due to the capacitive coupling ($C_1$). As a result of such capacitive feedbacks, any alternating current received at one input and amplified by the associated operational amplifier appears at the other input of the second operational amplifier which causes it to appear, when amplified, as an output signal of the same magnitude as the amplified output of the opposite side. Therefore, the amplification effect has been nullified and the inputted alternating current received between the differential input terminals passes to the differential output terminals as if the amplifier had a unity gain. Each noise signal at the output of one operational amplifier is in fact contributing to the elimination of the noise signal appearing at the differential outputs 9, 10. The overall arrangement stabilize itself readily to provide between terminals 19, 20 an analog signal free from any amplified AC component. This result is arrived at by the specific choice of capacitor $C_1$, $C_2$, as can be seen from the following circuit calculations:

If $E_1'$ is the potential at the junction of the feedback loop with the input line 12 of operational amplifier $OA_1$, while $E_1$ is the input signal received from cable K on such input terminal, the following relation obtains:

$$E_1' = E_1 + \frac{(E_{02} - E_1) \cdot R_4}{R_4 + R_6 + \frac{1}{C_2 S}} = \frac{E_1\left(R_6 + \frac{1}{C_2 S}\right) + E_{02} \cdot R_4}{R_4 + R_6 + \frac{1}{C_2 S}} \quad (1)$$

$$= \frac{E_1(1 + R_6 C_2 S) + E_{02} \cdot R_4 C_2 S}{1 + C_2 S (R_4 + R_6)}$$

where $R_4$ is the resistance on the input terminal, S is the Laplace transform, and $E_{02}$ is the outputted signal.

Similarly, for operational amplifier $OA_2$ the following relation obtains:

$$E_2' = \frac{E_2(1 + R_5 C_1 S) + E_{01} \cdot R_4 C_1 S}{1 + C_1 S (R_4 + R_5)} \quad (2)$$

Therefore, $$E_1' - E_2' = (E_{01} - E_{02}) \cdot \frac{R_1}{R_1 + R_2 + R_3} \quad (3)$$

-continued
$$= \frac{E_1(1 + R_6 C_2 S)}{1 + C_2 S (R_4 + R_6)} - \frac{E_2(1 + R_5 C_1 S)}{1 + C_1 S (R_4 + R_5)}$$

$$+ \frac{E_{02} \cdot R_4 C_2 S}{1 + C_2 S (R_4 + R_6)} - E_{01} \cdot \frac{R_4 C_1 S}{1 + C_1 S (R_4 + R_5)}.$$

If we assume for the sake of simplicity that $C_1 = C_2 = C$; $R_5 = R_6 = R$ and $K = (R_1/R_1 + R_2 + R_3)$ it follows that:

$$(E_{01} - E_{02})K = \frac{(1 + R_C S)(E_1 - E_2) + (E_{02} - E_{01}) R_4 C S}{1 + CS(R_4 + R)} \quad (4)$$

or:

$$(E_{01} - E_{02})\left(K + \frac{R_4 CS}{1 + CS(R_4 + R)}\right) \quad (5)$$

$$= (E_1 - E_2) \frac{1 + RCS}{1 + CS(R_4 + R)}.$$

Equation (5) may be rearranged as follows:

$$E_{01} - E_{02} = \frac{(E_1 - E_2)(1 + RCS)}{K + \frac{R_4 CS}{1 + CS(R + R_4)}} \cdot \frac{1}{1 + CS(R + R_4)} \quad (6)$$

$$= (E_1 - E_2) \frac{1 + RCS}{K + KCS(R + R_4) + R_4 CS}$$

$$= \frac{E_1 - E_2}{K} \cdot \frac{1 + RCS}{1 + CS\left\{(R + R_4) + \frac{R_4}{K}\right\}}.$$

From (6), if we introduce $G = (1/K) = $ closed loop gain, it follows:

$$(E_{01} - E_{02}) = G(E_1 - E_2) \cdot \frac{1 + RCS}{1 + CS\{R + (L + G) R_4\}} \quad (7)$$

$$= G(E_1 - E_2) \cdot \frac{1 + T_1 S}{1 + T_2 S} \quad (8)$$

where $T_1 = RC$ and $T_2 = \{R + (1 + G) R_4\} C$.

If we assume now that $R = R_4 = 3K\Omega$ and $C = 1 \mu F$, $G = 100$ then, $T_1 = 3$ msec and $T_2 = (G + 2)3$ msec = 306 msecs.

Figure 3:
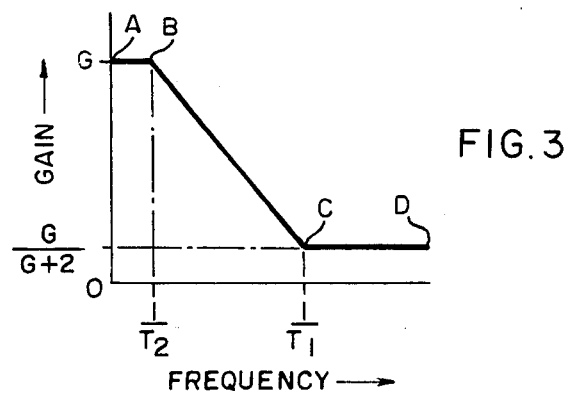
FIG. 3 is a curve illustrating the attenuating effect of the circuit according to the present invention in a differential amplifier.

Referring to FIG. 3, the characteristic of the attenuation built-in within the amplifier of FIG. 2 by capacitors $C_1$ and $C_2$ is shown for illustration in this particular example. For direct current, the gain is $$\frac{E_{01} - E_{02}}{E_1 - E_2} = G.$$

For the alternating current, however, the gain varies as shown typically in FIG. 3, along line ABCD. Point B corresponds approximately to a frequency of a half cycle. Point C corresponds approximately to 50 cycles in the particular example. From C on, e.g., for frequencies larger than $(1/2\pi.3_x10 - 3)$ the gain becomes $(G/G + 2, )$, and since G is as large as 100, the ratio $(E_{01} - E_{02}/E_1 - E_2)$ is practically unity.

More generally, from Equation (7), $$\frac{(E_{01} - E_{02})}{(E_1 - E_2)} = G \cdot \frac{1 + RCS}{1 + CS\{R + (1 + G)R_4\}}$$

which defines the attenuation for alternating currents beyond a certain frequency. From such equation it can be seen that by cross coupling the output of one amplifier through a capacitor to the input of the other amplifier in a differential amplifier configuration, the capacitance value is effectively multiplied by the closed loop DC gain setting, as far as filtering is concerned, thus providing active filtering. It is also worth mentioning that the AC gain is practically independent of the DC gain. By a proper choice of input resistor and cross coupling capacitors good AC normal mode rejection can be achieved while using only low values, and with no degeneration when varying the DC gain.

It is observed that while in a common filtering arrangement the capacitance must be as large as the magnitude and the frequency of the noise requires, in the arrangement according to the invention, the capacitance is inserted in series with a signal amplified by the gain $(R_1+R_2+R_3/R_1)$ of the overall amplifier arrangement. Therefore, a capacitor only G times smaller than with a common filter has to be used. Typically, for an AC component at 60 Hertz, only $1\mu F$ is required instead of $100\mu F$ for a common filter.

Although the invention has been described by reference to FIG. 2, e.g. where two operational amplifiers are mounted as a differential, it is understood that such arrangement is not the only mode of implementing capacitor feedback in cross connection between outputs and inputs so as to force the amplified AC component to zero. For instance, the invention applies to a single operational amplifier mounted with differential input and output, by making the two inputs and the two outputs a part of a circuit arrangement similar to the one of FIG. 2 with the same result.

A simple and effective active filtering of the AC component of a differential input DC gain amplifier with high input impedance is obtained by cross coupling with capacitors the outputs of the amplifier to opposite inputs thereof. Equal and opposite AC signals are thus being fed back to the respective inputs in such a way that the differential net input is forced to null. This arrangement does not cause any degeneration in the AC common mode rejection provided otherwise since the configuration has unity gain for the common mode input with or without the coupling capacitors according to the invention, e.g. any adjustment of the gain by resistor $R_1$ will leave filtering action unaffected. It is further observed that any unbalance, or any variation in the capacitance values have no adverse effect on the system.

I claim:

1. In a high impedance and high closed loop DC gain amplifier arrangement connected in circuit between two input terminals forming a differential input supplied with an analog signal and two output terminals, the combination of:

first and second operational amplifiers each having a non-inverting input, an inverting input and an output, the non-inverting inputs being connected to respective ones of said input terminals, the inverting inputs being connected to the opposite ends of an input resistor, the outputs being each connected to the associated inverting input through a corresponding output resistor and to a corresponding one of said output terminals to provide said closed loop DC gain;

with said input terminals being supplied with said analog signal together with an alternating current noise signal of a given frequency in the low frequency range;

a first capacitor connected between the output of one operational amplifier and the non-inverting input of the other operational amplifier, a second capacitor connected between the output of the other operational amplifier and the non-inverting input of the said one operational amplifier, said first and second capacitors having a value providing at and above said given frequency and AC gain substantially lower than said DC gain.

* * * * *